United States Patent [19]

Walls et al.

[11] Patent Number: 4,652,604
[45] Date of Patent: Mar. 24, 1987

[54] RADIATION-POLYMERIZABLE COMPOSITION AND ELEMENT CONTAINING A PHOTOPOLYMER COMPOSITION

[75] Inventors: John E. Walls, Hampton; Carlos Tellechea, Shrewsbury; Major S. Dhillon, Belle Mead, all of N.J.

[73] Assignee: American Hoechst Corporation, Somerville, N.J.

[21] Appl. No.: 762,091

[22] Filed: Aug. 2, 1985

[51] Int. Cl.$^4$ ............................ C08F 2/50; C08F 4/20
[52] U.S. Cl. ........................................ 522/63; 522/95
[58] Field of Search ..................................... 522/63, 95

[56] References Cited

U.S. PATENT DOCUMENTS

| | | | |
|---|---|---|---|
| 2,245,218 | 6/1941 | Murray et al. | 91/69 |
| 2,269,217 | 1/1942 | McNally et al. | 260/73 |
| 2,278,895 | 4/1942 | Rugeley et al. | 28/1 |
| 2,405,523 | 8/1946 | Sease et al. | 95/71 |
| 3,390,993 | 7/1968 | Borchers | 96/36.4 |
| 3,396,019 | 8/1968 | Uhlig | 96/33 |
| 3,471,589 | 10/1969 | Rinehart | 260/839 |
| 3,514,421 | 5/1970 | Kershaw et al. | 260/29.6 |
| 3,552,965 | 1/1971 | Notley et al. | 96/48 |
| 3,653,902 | 4/1972 | Notley et al. | 96/49 |
| 3,679,419 | 7/1972 | Gillich | 96/91 R |
| 3,801,328 | 4/1974 | Takimoto et al. | 96/35.1 |
| 3,847,614 | 11/1974 | Mattor | 96/75 |
| 3,867,147 | 2/1975 | Teuscher | 96/33 |
| 3,905,815 | 9/1975 | Bonham | 96/68 |
| 3,905,819 | 9/1975 | Sakurai et al. | 96/35.1 |
| 3,926,643 | 12/1975 | Chang | 96/115 P |
| 3,926,918 | 12/1975 | Shibata et al. | 260/73 L |
| 3,954,475 | 5/1976 | Bonham et al. | 96/67 |
| 3,963,618 | 6/1976 | Muir | 526/9 |
| 4,002,796 | 1/1977 | Baldi et al. | 478/375 |
| 4,115,232 | 9/1978 | Nyi et al. | 204/159.23 |
| 4,147,549 | 4/1979 | Held | 96/85 |
| 4,228,232 | 10/1980 | Rousseau | 430/271 |
| 4,289,838 | 9/1981 | Rowe et al. | 430/163 |
| 4,316,949 | 2/1982 | Petrellis et al. | 430/159 |
| 4,387,151 | 6/1983 | Bosse et al. | 430/175 |
| 4,413,091 | 11/1983 | Iwasaki et al. | 525/61 |

FOREIGN PATENT DOCUMENTS

| | | |
|---|---|---|
| 1144804 | 4/1983 | Canada . |
| 1153236 | 9/1983 | Canada . |
| 156015 | 6/1981 | Japan . |
| 078272 | 1/1982 | Japan . |
| 005910 | 11/1982 | Japan . |
| 196656 | 6/1983 | Japan . |
| 7410806 | 8/1974 | Netherlands . |
| 482731 | 6/1936 | United Kingdom . |
| 484476 | 5/1938 | United Kingdom . |
| 497146 | 12/1938 | United Kingdom . |
| 568914 | 4/1945 | United Kingdom . |
| 587797 | 5/1947 | United Kingdom . |
| 621784 | 4/1949 | United Kingdom . |
| 821092 | 9/1959 | United Kingdom . |
| 834337 | 5/1960 | United Kingdom . |
| 1352411 | 5/1974 | United Kingdom . |
| 518757 | 7/1976 | U.S.S.R. . |

OTHER PUBLICATIONS

Kirk-Othmar "Encyclopedia of Polymer Science & Technology," vol. 14, pp. 208-213 & 217-230, 1971.

Primary Examiner—Edward J. Smith
Assistant Examiner—Bernard Lipman
Attorney, Agent, or Firm—Richard S. Roberts

[57] ABSTRACT

This invention relates to a radiation polymerizable composition for use in a photographic element such as a lithographic printing plate comprising in admixture (a) a binder resin having the general formula

—A—B—C— wherein a plurality of each of components A, B and C occur in ordered or random sequence in the resin and wherein A is present in said resin at about 5% to about 20% by weight and comprises groups of the formula

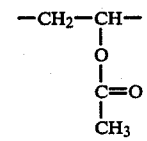

B is present in said resin at about 4% to about 30% by weight and comprises groups of the formula

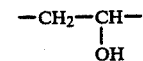

and C is present in said resin at about 50% to about 91% by weight and comprises acetal groups consisting of groups of the formulae

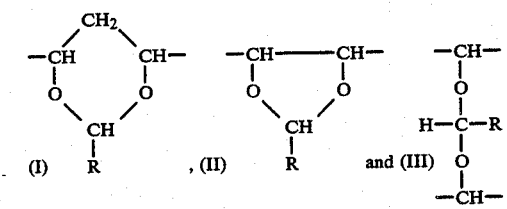

where R is lower alkyl or hydrogen, and wherein said group I is present in component C from about 75% to about 85%, group II is present in component C from about 3% to about 5%; and group III is present in component C from about 10% to about 22%.

(b) a photoinitiator;
(c) a diazonium salt; and
(d) a photopolymerizable mixture of
 (i) an acrylic monomer having two or more unsaturated groups; and
 (ii) an oligomer which is prepared by reacting one molar equivalent of a substantially linear polymeric compound having an active hydrogen group at each end thereof with a least two molar equivalents of a diisocyanate compound so as to form a prepolymer having an isocyanate group at each end thereof; and subsequently reacting said prepolymer with at least two equivalents of an ethylenically unsaturated compound having an active hydrogen group to provide said prepolymer with unsaturation at each end thereof.

14 Claims, No Drawings

RADIATION-POLYMERIZABLE COMPOSITION AND ELEMENT CONTAINING A PHOTOPOLYMER COMPOSITION

BACKGROUND OF THE INVENTION

The present invention relates to a radiation-polymerizable composition. More particularly, this invention relates to a radiation-polymerizable composition which may be employed to produce an improved photographic element such as a lithographic printing plate. Such plates show an increase of stability and press run life. The composition can be readily formed into adherent coatings useful in the graphic arts especially in the production of lithographic printing plates.

The use of radiation polymerizable coatings in the graphic arts is well known. Typically, the composition of such coatings can include a polymeric constituent, which may itself be radiation polymerizable, and a photosensitizer composition. Upon selected exposure of this coating to imaging energies, the radiation polymerizable species within the composition would either itself undergo a reaction or promote a reaction or degradation of one or more of the other components of the composition. It is, of course, readily appreciated that such reaction is only of value in such a system where it is essentially confined, or limited, to those areas of the composition impinged upon by such imaging energies. A negative working image thus created within the coating can then be "developed" by selective removal of the non-exposed components of the film or layer which have not been subjected to imaging energies. The ability to create such selective changes in coatings prepared from a radiation polymerizable composition has been appreciated for some time. The basic difference in the various approaches in the formulation of lithographic printing plates from radiation polymerizable compositions has been in the search for a system which is prepared from relatively inexpensive ingredients, does not require prolonged imaging energies (has a high quantum efficiency), is able to undergo an increased number of press runs and results in the creation of high resolution images within the composition which can be manifested without prolonged and elaborate development and, significantly, may be developed with a composition which does not necessarily contain organic solvents and which need contain only a minor amount of salts and surfactants.

Most such lithographic printing plates comprise a metal substrate which is coated with a light sensitive diazonium compound in admixture with suitable binding resins, photoinitiators, photopolymerizable compositions, colorants, stabilizers, exposure indicators, surfactants and the like.

Although the art is replete with photosensitive compositions which may be used for lithographic printing plates, the prior art composition's serviceability is restricted by their limited stability and number of press runs.

SUMMARY OF THE INVENTION

This invention relates to a radiation polymerizable composition for use in forming photographic elements such as lithographic printing plates, comprising in admixture as the coating base
(a) a binder resin having the general formula $$-A-B-C-$$

wherein a plurality of each of components A, B and C occur in ordered or random sequence in the resin and wherein A is present in said resin at about 5% to about 20% by weight and comprises groups of the formula

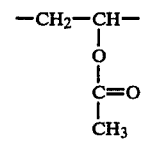

B is present in said resin at about 4% to about 30% by weight and comprises groups of the formula

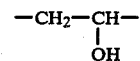

and C is present in said resin at about 50% to about 91% by weight and comprises acetal groups consisting of groups of the formulae

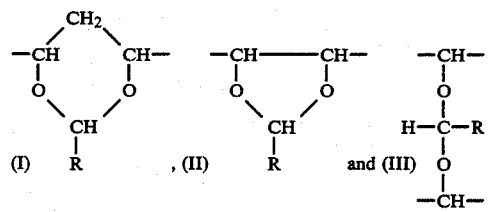

where R is lower alkyl or hydrogen, and wherein said group I is present in component C from about 75% to about 85%, group II is present in component C from about 3% to about 5%; and group III is present in component C from about 10% to about 22%;
(b) a photoinitiator;
(c) a photopolymerizable mixture of
  (i) an acrylic monomer having two or more unsaturated groups; and
  (ii) an oligomer which is prepared by reacting one molar equivalent of a substantially linear polymeric compound having an active hydrogen group at each end thereof with a least two molar equivalents of a diisocyanate compound so as to form a prepolymer having an isocyanate group at each end thereof; and subsequently reacting said prepolymer with at least two equivalents of an ethylenically unsaturated compound having an active hydrogen group to provide said prepolymer with unsaturation at each end thereof.

The invention further provides a photographic element comprising a substrate, the foregoing composition coated on the substrate, and a transparent, continuous, oxygen barrier film disposed on said composition.

DETAILED DESCRIPTION OF THE INVENTION

This invention relates to a radiation-polymerizable composition. More particularly, this invention relates to a radiation-polymerizable composition for use in forming photographic elements such as lithographic printing plates, which comprises in admixture as the base coating
(a) a binder resin having the general formula

—A—B—C— wherein a plurality of each of components A, B and C occur in ordered or random sequence in the resin and wherein A is present in said resin at about 5% to about 20% by weight and comprises groups of the formula

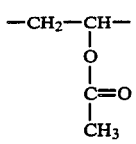

B is present in said resin at about 4% to about 30% by weight and comprises groups of the formula

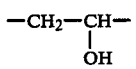

and C is present in said resin at about 50% to about 91% by weight and comprises acetal groups consisting of groups of the formulae

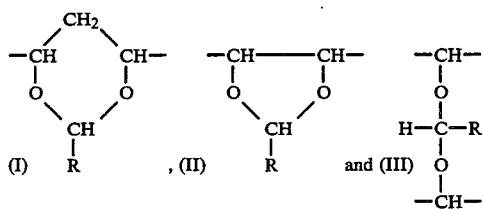

where R is lower alkyl or hydrogen, and wherein said group I is present in component C from about 75% to about 85%, group II is present in component C from about 3% to about 5%; and group III is present from in component C about 10% to about 22%.
(b) a photoinitiator;
(c) a photopolymerizable mixture of
 (i) an acrylic monomer having two or more unsaturated groups; and
 (ii) an oligomer which is prepared by reacting one molar equivalent of a substantially linear polymeric compound having an active hydrogen group at each end thereof with a least two molar equivalents of a diisocyanate compound so as to form a prepolymer having an isocyanate group at each end thereof; and subsequently reacting said prepolymer with at least two equivalents of an ethylenically unsaturated compound having an active hydrogen group to provide said prepolymer with unsaturation at each end thereof.

As used in describing the resin which may be used in this invention, the term "lower alkyl" refers to a straight or branched chain hydrocarbon having from 1 to 8 carbon atoms and containing no unsaturation.

The polyvinyl alcohol/polyvinyl acetate copolymers useful as a starting material for the production of the binder resin useful in this invention are those having from about 75% to about 80% hydrolization by weight and, preferably, an average molecular weight (AMW) of from about 5,000 to about 100,000. As used in this application hydrolization is on a weight basis and not a mole basis. Such copolymers are easily synthesized by methods known to those skilled in the art, or are commercially available. Suitable copolymers include Vinol 523 (AMW≅70,000) and Vinol 205 (AMW≅26,000) available from Air Products Co. of Allentown, Pennsylvania; Elvanol 52-22 (AMW≅72,000) available from DuPont of Wilmington, Delaware; and Gelvatol 20-30 (AMW≅10,000), Gelvatol 20-60 (AMW=60,000), and Gelvatol 20-90 (AMW≅90,000) available from Monsanto Co. of St. Louis, Missouri. Preferably, the copolymer has an average molecular weight in the range of about 50,000 to about 100,000.

In forming the resin of this invention, the copolymer is first dissolved in a solvent mixture of water and a hydroxyl group containing solvent. The solvent must be miscible with water, it must be a solvent for the copolymer, and it must be a solvent for the final resin product. Preferably, the hydroxyl group containing solvent is an aliphatic alcohol. Most preferably, the alcohol is one having from about 1 to 4 carbon atoms such as ethanol. In order to ensure that the copolymer molecules of the starting material are not so intertwined with each other nor having tertiary or quaternary structure to the extent that the reaction is interfered with to a substantial degree, the copolymer is preferably dissolved in the solvent mixture for at least 12 hours at elevated temperature (preferably above 50° C.) before the reaction proceeds. This reaction mixture is then maintained at a temperature of at least 50° C. and mixed with vigorous agitation which continues throughout the reaction. Over a period of several hours, an aliphatic aldehyde is then titrated into the reaction mixture to form the cyclic acetals.

The process steps for preparing the foregoing resin include first dissolving a polyvinyl alcohol/polyvinyl acetate copolymer having from about 75% to about 80% hydrolization in a solvent mixture of water and a hydroxyl-group containing solvent to form a reaction solution. This is usually conducted for at least about 12 hours at a temperature of from about 20° C. to the boiling point of the solution depending on the molecular weight of the copolymer. The solution is then adjusted to at least about 50° C. while adding a catalytic amount, preferably from about 1.0% to about 1.5% by weight of an organic sulfonic or inorganic mineral acid. This is a catalytic amount of the acid and is insufficient to cause hydrolization. Titrated into the acidified mixture is an aliphatic aldehyde having the formula R-CHO, wherein R is hydrogen or lower alkyl. The aldehyde is added in an amount sufficient to produce a degree of acetal formation of from about 50% to about 91% by weight. During this titration an additional amount of said hydroxyl group containing solvent is added into said reaction mixture to prevent unwanted precipitation. Preferably one vigorously mixes said reaction mixture throughout the foregoing steps. Preferably the acid is then removed from the mixture by evaporation or the mixture is neutralized with an alkaline salt to a pH of from about 6.5 to 7.5 to quench said reaction mixture. One then effects precipitation of said reaction mixture; washes the precipitate with water; and dries the precipitate so as to have less than about 1% water residue.

The preferred aldehyde is one having the formula R-CHO, wherein R is hydrogen or lower alkyl. Most preferably the aldehyde is acetaldehyde or propionaldehyde. For use in the production of a lithographic printing plate, proprionaldehyde is preferred. The amount of aldehyde titrated into the reaction mixture is preferably from about 25% to about 100% by weight of the copolymer. More preferably the amount of aldehyde is from about 28% to about 67% by weight of the copolymer.

As the acetal groups are formed at the expense of the hydroxyl content of the copolymer, the water solubility is reduced. In order to prevent premature precipitation of the product formed, additional amounts of the hydroxyl group containing solvent used in the solvent mixture are titrated simultaneously with the aldehyde to accommodate the product's reduced water solubility and increasing solvent solubility.

In order to properly form the preferred acetal, a catalytic amount of an acid is required to be present during the titrations. Preferably the acid used is an inorganic mineral acid or an organic sulfonic acid. Suitable inorganic minerals acids include hydrochloric acid, sulfuric acid and phosphoric acid. Suitable organic sulfonic acids include p-toluene sulfonic acid and stilbene disulfonic acid. Most preferably, the acid catalyst is hydrochloric acid. The acid catalyst is preferably present in the reaction mixture in the amount of from about 1.0% to about 1.5% by weight of the total reaction mixture.

After the titrations are completed, the reaction mixture is preferably neutralized with an alkaline salt in order quench the reaction mixture so as to prevent the deacetalization which may otherwise occur. The neutralization should adjust the pH of the reaction mixture to about 6.5 to about 7.5, and should preferably be 7.0. Suitable alkaline salts for the neutralization include sodium carbonate, potassium carbonate, sodium hydroxide and potassium hydroxide, with sodium carbonate being the most preferred.

After neutralization, the reaction mixture is preferably, although not necessarily, cooled to room temperature (about 22° to 25° C.) and then slowly mixed with water or other suitable compositions such as acetone or methyl ethyl ketone with continued vigorous agitation to effect precipitation. The resulting precipitate is water washed to remove all remaining acid, aldehyde and unreacted copolymer, and is then warm air dried so as to have less than 1% water residue.

The resulting resin contains acetal groups consisting of three types: six-membered cyclic acetals which are present from about 75% to 85%, five-membered cyclic acetals which are present from about 3% to 5% and intermolecular acetals which are present from about 10% to 22%. It is important to the uses of this resin that all three types of acetal groups are present and in their indicated concentrations. This resin is more fully described in U.S. patent application Ser. No. 762,089, filed on even date herewith, and which is incorporated herein by reference.

Preferably, the polymeric binder is present in the composition at a percent solids level of from about 20% to about 75% by weight. A more preferred range is from about 30% to about 65% by weight and, most preferably, the polymeric binder is present at a percent solids level of from about 35% to about 50% by weight.

Suitable photoinitiators which may be used in this invention are preferably those free-radical photoinitiators having a maximum absorption range of from about 320 to about 400 nm. Examples include the acetophenones, benzophenones, triazines, benzoins, benzoin ethers, xanthones, thioxanthones, acridenes and benzoquinones. More preferred of these are the triazines having the formula

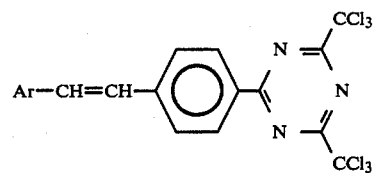

wherein Ar is

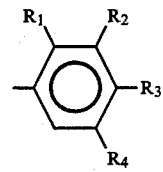

and $R_1$, $R_2$, $R_3$ and $R_4$ are, independently, hydrogen, chlorine, bromine, alkoxy, alkyl ketone, naphthyl or anthracyl, especially bis-trichloromethyl triazine. The most preferred photoinitiator is 2-stilbenyl-4,6-di(trichloromethyl) triazine.

The photoinitiator is preferably present in the composition at a percent solids level of about 1.5% to about 8.0% or more by weight, more preferably about 2.0% to about 6.0% by weight and is most preferably present at a percent solids level of from about 3.0% to about 4.0% by weight.

The photopolymerizable mixture of the subject invention is comprised of, in admixture, an acrylic monomer which has two or more unsaturated groups and a urethane oligomer which is hereinafter described.

The monomer is an ethylenically unsaturated compound having from two or more unsaturated groups and is capable of reacting with the urethane oligomer upon exposure to imaging radiation. The monomer is characterized as having the unsaturated groups being acrylate or methacrylate esters. The preferred monomer is either a solid or liquid having a viscosity of greater than about 700 cps at 25° C., preferably greater than about 2000 cps at 25° C. Most preferably, the monomer has a viscosity of greater than about 4000 cps at 25° C.

Examples of compounds which are suitable for use as the monomer of this invention include trimethylol propane triacrylate and the ethoxylated or propoxylated analogs thereof, trimethylol propane tri-methacrylate and the ethoxylated or propoxylated analogs thereof, pentaerythritol triacrylate, pentaerythritol trimethacrylate, dipentaerythritol monohydroxy pentaacrylate, dipentaerythritol monohydroxy pentamethacrylate, dipentaerythritol hexaacrylate, dipentaerythritol hexamethacrylate, pentaerythritol tetracrylate and pentaerythritol tetramethacrylate. Preferably, the monomer is dipentaerythritol monohydroxy pentaacrylate, although a combination of suitable monomers is also advantageous.

The monomer is present at a percent solids level which is preferably in the range of from about 10% to about 35% by weight. More preferably, the monomer is present at a percent solids level of from about 15% to about 30% by weight and most preferably from about 15% to about 25% by weight.

The oligomeric component of the photopolymerizable mixture of the composition of the subject invention is a photocurable oligomer or polymer which is prepared by reacting one molar equivalent of a substantially linear polymeric compound having an active hydrogen group at each end thereof with a least two molar equivalents of a diisocyanate compound so as to form a prepolymer having an isocyanate group at each end thereof; and subsequently reacting said prepolymer with at least two equivalents of an ethylenically unsaturated compound having an active hydrogen group to provide said prepolymer with unsaturation at each end thereof. The preferred oligomer is one having a polyester backbone prepared from an aliphatic dicarboxylic acid and an aliphatic diol. The preferred dicarboxylic acid is linear and has from about 2 to 8 carbon atoms. The polyester is prepared in such a way that the compound is symmetrical and hydroxy-terminated. A procedure for doing so would be known to the skilled artisan, for example as shown in Sandler and Kato, *Polymer Synthesis*, Vol. 2, Academic Press 1977, pp 140–167. The polyester polyol is in turn reacted with preferably an aliphatic, more preferably a cyclic aliphatic, diisocyanate having from about 2 to 13 carbon atoms. The diisocyanate is reacted with the polyester polyol so that one of the two isocyanate groups is reacted with the terminal hydroxy group on the end of the polyester backbone. The remaining isocyanate group is subsequently reacted with a hydroxy-containing acrylate or methacrylate. For example, 1,6-hexane diol is reacted with adipic acid in a mole ratio of greater than 1:1 (adipic acid/1,6-hexane diol) to form a polyester and then reacted with dicyclohexyl-methane-4,4'-bis diisocyanate in a 2:1 mole ratio (diisocyanate/polyester). The product is reacted with 2-hydroxy ethyl acrylate in a 2:1 mole ratio (acrylate/diisocyanate-polyester product) to form an oligomer useful in this invention. The oligomer may be characterized as follows:

U—D—R—D—U wherein:
R prior to the reaction to form the oligomer is an essentially linear polymeric compound having two end groups with active hydrogen functionality,
D prior to the reaction to form the oligomer is a diisocyanate compound, and
U prior to the reaction to form the oligomer is a compound having ethylenic unsaturation and a group with an active hydrogen.

Examples of compounds which can be used as the R group are polyesters obtained by reacting a dicarboxylic acid with a diol in such a fashion that the mole ratio of diol to dicarboxylic acid is greater than 1:1 so as to have a symmetrical hydroxyl terminated polymer; polyethers obtained by reacting a diol with an alkylene oxide in such a fashion that the mole ratio of diol to alkylene oxide is greater than 1:1 so as to have a symmetrical hydroxyl terminated polymer; and epoxies obtained by reacting a symmetrical diglycidyl compound with a diol in such a fashion that the mole ratio of diol to diglycidyl compound is greater than 1:1 so as to have a symmetrical hydroxyl terminated polymer.

More specifically, R groups which are polyesters are prepared from dicarboxylic acids such as oxalic, malonic, succinic, glutaric, adipic, pimelic, suberic, azelaic and sebacic acids, and from diols such as ethylene glycol, diethylene glycol, neopentyl glycol, propylene glycol, dipropylene glycol, 1,3-butane diol, 1,4-butane diol, 1,6-hexanediol and 2-ethyl-1,6-hexane diol.

R groups which are polyethers are prepared from diols such as ethylene glycol, diethylene glycol, propylene glycol, dipropylene glycol, neopentyl glycol, 1,3-butane diol, 1,4-butane diol, 1,6-hexane diol and 2-ethyl-1,6-hexane diol, and alkylene oxides such as ethylene oxide, propylene oxide and tetrahydrofuran.

R groups which are epoxies are prepared from diols such as ethylene glycol, diethylene glycol, propylene glycol, dipropylene glycol, neopentyl glycol, 1,3-butane diol, 1,4-butane diol, 1,6-hexane diol and 2-ethyl-1,6-hexane diol, and diglycidyls such as diglycidyl isophthalate, diglycidyl terephthalate, diglycidyl phthalate and bisphenol-A diglycidyl ether.

Examples of compounds which can be used as the D group are ethylene diisocyanate, propylene diisocyanate, tetramethylene diisocyanate, dicyclohexylmethane-4,4'-diisocyanate, hexamethylene diisocyanate, 1-methyl-2,3-diisocyanatocyclohexane, 1-methyl-2,6-diisocyanatocyclohexane, lysine diisocyanate, 4,4'-ethylene-bis-(cyclohexyl isocyanate) and isophorone diisocyanate.

Example of compounds which may be used as the U group include hydroxyethyl acrylate, hydroxypropyl methacrylate, hydroxypropyl acrylate, hydroxyethyl methacrylate, 1,3-butane diol acrylate, 1,3-butane diol methacrylate, 2,4-butane diol acrylate, 1,4-butane diol methacrylate, neopentyl glycol acrylate, neopentyl glycol methacrylate, pentaerythritol triacrylate, pentaerythritol trimethacrylate and the mono acrylate and methacrylate of polyethylene glycol, polypropylene glycol and polycopolymers of ethylene glycol and propylene glycol.

Useful oligomers in the practice of this invention include those oligomers preferably having a molecular weight of from about 1500 to about 4000, more preferably from about 2000 to about 3500 and, most preferably, the oligomer has a molecular weight of about 3000. It is desirable that the oligomer be in solid form or semi-solid form, i.e. having a viscosity of greater than about 480,000 cps at 25° C. The composition preferably contains the oligomer at a percent solids level of from about 10% to about 35% by weight. More preferably the oligomer is present in the radiation polymerizable composition of this invention in an amount of from about 15% to about 30% by weight and it is most preferably present at a percent solids level of from about 15% to about 25% by weight. A fuller description of such oligomers appears in co-pending U.S. patent application Ser. No. 678,912 filed on Dec. 6, 1984 and which is incorporated herein by reference.

One of the significant aspects of this invention is the fact that the photosensitive composition produced thereby may be developed with a composition which does not necessarily contain any organic solvents and need only contain a minor amount of salts and surfactants. There is a great advantage in the elimination of organic solvents in the developer composition due to the fact that such solvents are expensive and their effluent is toxic.

Other components which may be included in the radiation-polymerizable composition of this invention include acid stabilizers, exposure indicators, plasticizers, photoactivators and colorants.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid, and mixtures thereof. Preferably, the acid stabilizer is phosphoric acid. When used, the acid stabilizer is preferably present in the radiation-polymerizable composition in the amount of from about 0.3% to about 2.0%, and most preferably from about 0.75% to about 1.5%, although the skilled artisan may use more or less as desired.

Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably, dioctylphthalate. The plasticizer is preferably present in the composition of this invention in an amount of from about 0.5% to about 1.25% by weight, although the skilled artisan may use more or less as desired.

Colorants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 1.5% to about 4.0% by weight, more preferably from about 1.75% to about 3.0% and most preferably from about 2.0% to about 2.75%, although the skilled artisan may use more or less as desired.

In order to form a coating composition for the production of lithographic printing plates, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol, and ketones such as methyl ethyl ketone, or mixtures thereof. Preferably, the solvent comprises a mixture of tetrahydrofuran, propylene glycol monomethyl ether and butyrolactone. In general, the solvent system is evaporated from the coating composition once it is applied to an appropriate substrate, however, some insignificant amount of solvent may remain as residue.

The foregoing describes the components, and solvents for said components, useful in preparing a radiation polymerizable base coating. In the production of free-radical initiated photopolymerizable coatings, it is widely recognized that such reactions are subject to a quenching phenomenum by triplet oxygen of the free radicals formed by irradiating the initiator. The premature return of the free-radicals to the energy ground state precludes the required energy transfer necessary to effect the polymerization reaction.

An art recognized method useful in preventing triplet oxygen quenching of radiation formed free-radicals is overcoating the base coating with a water-soluble polymeric resin. Preferably such resins must be transparent, film-forming polymers which substantially act as oxygen barrier layers and which are inert and incompatible with all ingredients comprising the base coating, and be soluble in water or mixtures of water and solvents.

Examples of polymers which are suitable for use as an overcoat producing polymer for the purpose of this invention include polyvinyl alcohol, polyvinyl alcohol/polyvinyl acetate copolymer, polyvinyl pyrrolidone, polyvinyl pyrrolidone/polyvinyl acetate copolymer, polyacrylic acid, poly(butadiene-maleic acid), polyvinyl methyl ether and poly butyl acrylic acid.

Substrates useful for coating with the composition of this invention to form a lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electrolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the base composition of the present invention, preferably at a coating weight of from about 0.6 g/m$^2$ to about 2.5 g/m$^2$, more preferably from about 0.8 g/m$^2$ to about 2.0 g/m$^2$ and most preferably from about 1.2 g/m$^2$ to about 1.5 g/m$^2$, although these coating weights are not critical to the practice of this invention, and dried. The thusly coated plate is then overcoated with an aqueous solution of the polymeric film-forming resin, preferably at a coating weight of from about 0.5 g/m$^2$ to about 6.0 g/m$^2$, more preferably from about 0.75 g/m$^2$ to about 4.0 g/m$^2$ and most preferably from about 1.0 g/m$^2$ to about 2.5 g/m$^2$, although these coating weights are not critical to the practice of this invention, and dried.

Preferably the thusly prepared lithographic printing plate is exposed to actinic radiation through a negative test flat so as to yield a solid 6 on a 21 step Stouffer exposure wedge after development. The exposed plate is then developed with a suitable aqueous developer composition such as a developer which comprises an aqueous solution containing one or more of the following groups:

(a) a sodium, potassium or lithium salt of octyl, decyl or dodecyl monosulfate;
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807.

In conventional use, the developed plate is finished with a subtractive finisher such as a hydrophilic polymer. Examples include cold water-soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it is first treated with a solution designed to prevent loss of hydrophilicity of the background during baking. An example of an effective solution is disclosed in U.S. Pat. No. 4,355,096, the disclosure of which is hereby incorporated herein by reference. The thusly prepared plate is then heat treated by baking at a temperature of from about 180° C. up to the annealing temperature of the substrate, most preferably about 240° C. The effective baking time is inversely proportional to the temperature and averages in the range of from about 2 to about 15 minutes. At 240° C. the time is about 7 minutes.

The following examples are illustrative of the invention but it is understood that the invention is not limited thereto.

In each of the following examples, the binder resin used is a binder resin having the general formula

—A—B—C— wherein a plurality of each of components A, B and C occur in ordered or random sequence in the resin and wherein A is present in said resin at about 5% to about 20% by weight and comprises groups of the formula

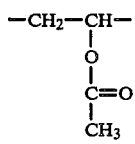

B is present in said resin at about 4% to about 30% by weight and comprises groups of the formula

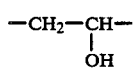

and C is present in said resin at about 50% to about 91% by weight and comprises acetal groups consisting of groups of the formulae

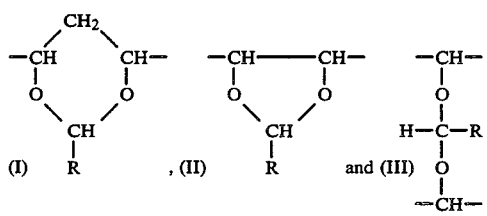

where R is lower alkyl or hydrogen, and wherein said group I is present in component C from about 75% to about 85%, group II is present in component C from about 3% to about 5%; and group III is present from in component C about 10% to about 22%.

EXAMPLE 1

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

| | % w/w |
|---|---|
| Binder resin formed by reacting 75.0 g of Vinol 523, a polyvinyl alcohol/polyvinyl acetate copolymer which has from about 75% to 80% hydroxyl groups by weight and an average molecular weight of about 70,000, and is dissolved in a solution comprising 225.0 g of water and 200.0 g of ethanol for 16 hours at 70° C. after which 10.13 g of hydrochloric acid (37%) is added and the temperature adjusted to 60° C. while mixing vigorously with 37.66 g of propionaldehyde. Using standard analytical techniques this product is found to consist of 13.6% acetate, 9.8% hydroxyl and 76.6% acetal groups. Of the acetal groups, 80% are found to be six-membered cyclic acetal, 4% are five-membered cyclic acetal, and 16% are intermolecular acetals. | 4.54 |
| Dipentaerythritol monohydroxy pentaacrylate | 2.01 |
| Diacrylated urethane oligomer formed by reacting 1,6-hexane diol with adipic acid in a mole ratio of greater than 1:1 (adipic acid/1,6-hexane diol) to form a polyester and then reacting with dicyclohexyl-methane-4,4'-bis diisocyanate in a 2:1 mole ratio (diisocyanate/polyester). The product is then reacted with 2-hydroxy ethyl acrylate in a 2:1 mole ratio (acrylate/diisocyanate polyester product) | 2.01 |
| 2-Stilbenyl-4,6-di(trichloromethyl)triazine | 3.20 |
| Methyl cellosolve | 88.24 |
| | 100.00 |

The coated and dried plate is then whirl coated with a solution having the following composition:

| | % w/w |
|---|---|
| polyvinyl alcohol | 2.0 |
| ethanol | 45.0 |

-continued

|  | % w/w |
|---|---|
| water | Balance |

The coated and dried plate is exposed to actinic radiation through a negative exposure flat so as to yield a solid seven on a 21 step Stouffer step wedge. The plate is developed using the following composition, which has a pH of 7.3:

|  | % w/w |
|---|---|
| sodium benzoate | 6.9 |
| sodium octyl sulfate | 3.0 |
| trisodium phosphate | 2.8 |
| H$_2$O | Balance | and finished with the following composition

|  | % w/w |
|---|---|
| Dextrin*** | 5.52 |
| sodium octyl sulfate | 1.61 |
| Triton X-100**** | 1.00 |
| Givgaurd DXN***** | 0.05 |
| H$_3$PO$_4$ | 2.37 |
| H$_2$O | Balance |

***hydrolyzed tapioca dextrin
****isooctyl phenol polyoxyethylene ethanol; 4.5 moles ethylene oxide
*****1,4-dimethyl-6-acetoxy-dioxane and run on a Heidelberg GTO sheet fed press using abrasive ink, over-packing, and a Dahlgren dampening system until image breakdown is achieved. Under these conditions the plate provides 475,000 acceptable impressions.

EXAMPLE 2

A lithographic printing plate is prepared and processed as described in Example 1 except that the diacrylated urethane oligomer is omitted. Under these conditions the plate provides only 245,000 acceptable impressions.

EXAMPLE 3

A lithographic printing plate is prepared and processed as described in Example 1 except that the dipentaerythritol monohydroxy pentaacrylate is omitted. Under these conditions the plate provides only 260,000 acceptable impressions.

EXAMPLE 4

A lithographic printing plate is prepared and processed as described in Example 1 except that the overcoat composition is omitted. Under these conditions the plate cannot be acceptably imaged. It is not possible to print any images with the plate as prepared.

EXAMPLE 5

A lithographic printing plate is prepared and processed as described in Example 1 except that the 2-stilbenyl-4,6-di(trichloromethyl)triazine is omitted. Under these conditions the plate cannot be acceptably imaged. It is not possible to print any image with the plate as prepared.

EXAMPLE 6

An 8"×25" section of grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m$^2$. The anodized plate is well rinsed and hydrophilized by immersing the plate into a solution of polyvinyl phosphonic acid. The plate is well rinsed and dried. The thusly prepared plate is whirler coated with a solution having the following composition:

|  | % w/w |
|---|---|
| Binder resin formed by reacting 75.0 g of Elvanol 52-22, a polyvinyl alcohol/polyvinyl acetate copolymer which has from about 75% to 80% hydroxyl groups by weight and an average molecular weight of about 90,000, and is dissolved in a solution comprising 225.0 g of water and 200.0 g of ethanol for 16 hours at 70° C. after which 10.13 g of hydrochloric acid (37%) is added and the temperature adjusted to 60° C. while mixing vigorously with 28.62 g of acetaldehyde. Using standard analytical techniques the product is found to consist of 17.2% acetate, 13.6% hydroxyl and 69.2% acetal groups. Of the acetal groups, 80% are found to be six-membered cyclic acetal, 4% are five-membered cyclic acetal, and 16% are intermolecular acetals. | 4.54 |
| Pentaerythritol tetraacrylate | 2.01 |
| Diacrylated urethane oligomer formed by reacting 1,6-hexane diol with adipic acid in a mole ratio of greater than 1:1 (adipic acid/1,6-hexane diol) to form a polyester and then reacting with dicyclohexyl-methane-4,4'-bis diisocyanate in a 2:1 mole ratio (diisocyanate/polyester). The product is then reacted with 2-hydroxy ethyl acrylate in a 2:1 mole ratio (acrylate/diisocyanate polyester product) | 2.01 |
| 2-Stilbenyl-4,6-di(trichloromethyl)triazine | 3.20 |
| Methyl cellosolve | 88.24 |
|  | 100.00 |

The coated and dried plate is then whirl coated with a solution having the following composition:

|  | % w/w |
|---|---|
| polyvinyl alcohol | 2.0 |
| ethanol | 45.0 |
| water | Balance |

The coated and dried plate is exposed to actinic radiation through a negative exposure flat so as to yield a solid seven on a 21 step Stouffer step wedge. The plate is developed using the following composition which has a pH of 7.3:

|  | % w/w |
|---|---|
| sodium benzoate | 6.9 |
| sodium octyl sulfate | 3.0 |
| trisodium phosphate | 2.8 |
| monosodium phosphate | 1.5 |
| H$_2$O | Balance | and finished with the following composition

|  | % w/w |
|---|---|
| Dextrin*** | 5.52 |
| sodium octyl sulfate | 1.61 |
| Triton X-100**** | 1.00 |
| Givgaurd DXN***** | 0.05 |

|  | % w/w |
|---|---|
| H₃PO₄ | 2.37 |
| H₂O | Balance |

***hydrolyzed tapioca dextrin
****isooctyl phenol polyoxyethylene ethanol; 4.5 moles ethylene oxide
*****1,4-dimethyl-6-acetoxy-dioxane and run on a Heidelberg sheet fed press using abrasive ink, over-packing, and a Dahlgren dampening system until image breakdown is achieved. Under these conditions the plate provides 490,000 acceptable impressions.

EXAMPLE 7

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

|  | % w/w |
|---|---|
| Binder resin formed by reacting 40.0 g of Gelvatol 20-60, a polyvinyl alcohol/polyvinyl acetate copolymer which has from about 57% to 80% hydroxyl groups by weight and an average molecular weight of about 60,000, and is dissolved in a solution comprising 120.0 g of water and 120.0 g of ethanol for 16 hours at 70° C. after which 10.13 g of hydrochloric acid (37%) are added and the temperature is adjusted to 60° C. while mixing vigorously with 27.41 g of hexanal. Using standard analytical techniques the product is found to consist of 15.2% acetate, 7.6% hydroxyl and 77.2% acetal groups. Of the acetal groups, 80% are found to be six-membered cyclic acetal, 4% are five-membered cyclic acetal, and 16% are intermolecular acetals. | 4.54 |
| Pentaerythritol tetraacrylate | 2.01 |
| Diacrylated urethane oligomer formed by reacting 1,6-hexane diol with adipic acid in a mole ratio of greater than 1:1 (adipic acid/1,6-hexane diol) to form a polyester and then reacting with dicyclohexyl-methane-4,4'-bis diisocyanate in a 2:1 mole ratio (diisocyanate/polyester). The product is then reacted with 2-hydroxy ethyl acrylate in a 2:1 mole ratio (acrylate/diisocyanate polyester product) | 2.01 |
| 2-Stilbenyl-4,6-di(trichloromethyl)triazine | 3.20 |
| Methyl cellosolve | 88.24 |
|  | 100.00 |

The coated and dried plate is then whirl coated with a solution having the following composition:

|  | % w/w |
|---|---|
| polyvinyl alcohol | 2.0 |
| ethanol | 45.0 |
| water | Balance |

The coated and dried plate is exposed to actinic radiation through a negative exposure flat so as to yield a solid seven on a 21 step Stouffer step wedge. The plate is developed using the following composition which has a pH of 7.3:

|  | % w/w |
|---|---|
| sodium benzoate | 6.9 |
| sodium octyl sulfate | 3.0 |
| trisodium phosphate | 2.8 |
| monosodium phosphate | 1.5 |
| H₂O | Balance | and finished with the following composition

|  | % w/w |
|---|---|
| Dextrin*** | 5.52 |
| sodium octyl sulfate | 1.61 |
| Triton X-100**** | 1.00 |
| Givguard DXN***** | 0.05 |
| H₃PO₄ | 2.37 |
| H₂O | Balance |

***hydrolyzed tapioca dextrin
****isooctyl phenol polyoxyethylene ethanol; 4.5 moles ethylene oxide
*****1,4-dimethyl-6-acetoxy-dioxane and run on a Heidelberg sheet fed press using abrasive ink, over-packing, and a Dahlgren dampening system until image breakdown is achieved. Under these conditions the plate provides 450,000 acceptable impressions.

EXAMPLE 8

As a comparative example, an 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath werein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

|  | % w/w |
|---|---|
| Binder resin Formvar 12/85, a polyvinyl acetal resin obtained from Monsanto Corporation of St. Louis, Missouri which has been prepared according to U.S. Pat. No. 2,179,051. Using standard analytical techniques the analyzed product is found to have an average molecular weight of 32,000 and to consist of 23.5% acetate, 5.7% hydroxyl and 70.8% acetal groups. Of the acetal groups, 90-95% are found to be six-membered cyclic acetals, 0% are five-membered cyclic acetals and 5-10% are intermolecular acetals. | 4.54 |
| Pentaerythritol tetraacrylate | 2.01 |
| Diacrylated urethane oligomer formed by reacting 1,6-hexane diol with adipic acid in a mole ratio of greater than 1:1 (adipic acid/1,6-hexane diol) to form a polyester and then reacting with dicyclohexyl-methane-4,4'-bis diisocyanate in a 2:1 mole ratio (diisocyanate/polyester). The product is then reacted with 2-hydroxy ethyl acrylate in a 2:1 mole ratio (acrylate/diisocyanate polyester product) | 2.01 |
| 2-Stilbenyl-4,6-di(trichloromethyl)triazine | 3.20 |
| Methyl cellosolve | 88.24 |
|  | 100.00 |

The coated and dried plate is then whirl coated with a solution having the following composition:

| | % w/w |
|---|---|
| polyvinyl alcohol | 2.0 |
| ethanol | 45.0 |
| water | Balance |

The coated and dried plate is exposed to actinic radiation through a negative exposure flat so as to yield a solid seven on a 21 step Stouffer step wedge. The plate is attempted to be developed using the following composition which has a pH of 7.3:

| | % w/w |
|---|---|
| sodium benzoate | 6.9 |
| sodium octyl sulfate | 3.0 |
| trisodium phosphate | 2.8 |
| monosodium phosphate | 1.5 |
| $H_2O$ | Balance |

It is found that the plate cannot be developed. No indication of coating removal or desensitization is detected.

It can be readily observed that plates prepared according to this invention (Example 1) show substantially increased press runs and may be developed with compositions which do not contain organic solvents.

We claim:

1. A radiation-polymerizable composition comprising in admixture
   (a) a binder resin having the general formula

—A—B—C— wherein a plurality of each of components A, B and C occur in ordered or random sequence in the resin and wherein A is present in said resin at about 5% to about 20% by weight and comprises groups of the formula

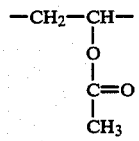

B is present in said resin at about 4% to about 30% by weight and comprises groups of the formula

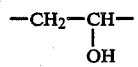

and C is present in said resin at about 50% to about 91% by weight and comprises acetal groups consisting of groups of the formulae

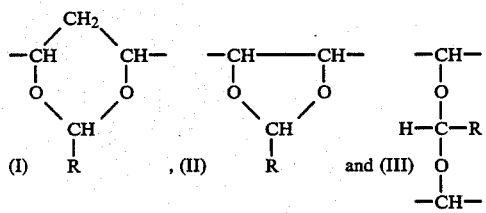

where R is lower alkyl or hydrogen, and wherein said group I is present in component C from about 75% to about 85%, group II is present in component C from about 3% to about 5%; and group III is present in component C from about 10% to about 22%.
   (b) a photoinitiator; and
   (c) a photopolymerizable mixture of
     (i) an acrylic monomer having two or more unsaturated groups; and
     (ii) an oligomer which is prepared by reacting one molar equivalent of a substantially linear polymeric compound having an active hydrogen group at each end thereof with a least two molar equivalents of a diisocyanate compound so as to form a prepolymer having an isocyanate group at each end thereof; and subsequently reacting said prepolymer with at least two equivalents of an ethylenically unsaturated compound having an active hydrogen group to provide said prepolymer with unsaturation at each end thereof.

2. The composition of claim 1 wherein said monomer is an ethylenically unsaturated compound having two or more unsaturated groups and being capable of reacting with said oligomer.

3. The composition of claim 2 wherein said monomer is further characterized as having the unsaturated groups being acrylate or methacrylate esters.

4. The composition of claim 3 wherein said monomer is dipentaerythritol monohydroxy pentaacrylate.

5. The composition of claim 1 wherein said oligomer is a diacrylated polyurethane.

6. The composition of claim 1 wherein said monomer is present in said composition in an amount of from about 10% to about 35% by weight.

7. The composition of claim 6 wherein said monomer is present in said composition in an amount of from about 15% to about 30% by weight.

8. The composition of claim 1 wherein R is ethyl.

9. The composition of claim 1 wherein said oligomer is present in said composition in an amount of from about 10% to about 35% by weight.

10. The composition of claim 9 wherein said oligomer is present in said composition in an amount of from about 15% to about 30% by weight.

11. The composition of claim 10 wherein said oligomer is present in said composition in an amount of from about 15% to about 25% by weight.

12. The composition of claim 1 wherein said photoinitiator comprises a triazine compound.

13. The composition of claim 12 wherein said photoinitiator comprises a bis-trichloromethyl triazine having the formula

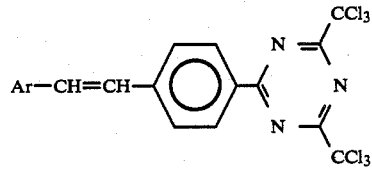

wherein Ar is

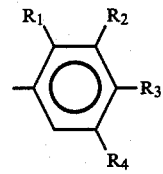

and $R_1$, $R_2$, $R_3$ and $R_4$ are, independently, hydrogen, chlorine, bromine, alkoxy, alkyl ketone, naphthyl or anthracyl.

14. The composition of claim 13 wherein said photoinitiator is 2-stilbenyl-4,6-di(trichloromethyl)triazine.